United States Patent
Yasuhara et al.

(10) Patent No.: US 8,753,448 B2
(45) Date of Patent: Jun. 17, 2014

(54) APPARATUS AND METHOD FOR MANUFACTURING COMPOUND SEMICONDUCTOR, AND COMPOUND SEMICONDUCTOR MANUFACTURED THEREBY

(75) Inventors: Hideki Yasuhara, Kawasaki (JP); Akira Bandoh, Chichibu (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 3 days.

(21) Appl. No.: 13/403,571

(22) Filed: Feb. 23, 2012

(65) Prior Publication Data
US 2012/0146191 A1    Jun. 14, 2012

(51) Int. Cl.
C23C 16/458    (2006.01)
B05C 13/02     (2006.01)

(52) U.S. Cl.
CPC .............. *C23C 16/4583* (2013.01); *C23C 16/4584* (2013.01)
USPC .......................... 118/728; 118/500

(58) Field of Classification Search
CPC .................. C23C 16/4583; C23C 16/4584
USPC .................................. 118/728, 500
See application file for complete search history.

(56) References Cited

U.S. PATENT DOCUMENTS

| | | | | |
|---|---|---|---|---|
| 4,439,267 A * | 3/1984 | Jackson, Jr. | ............... | 117/102 |
| 4,473,455 A * | 9/1984 | Dean et al. | ............ | 204/298.15 |
| 5,169,453 A * | 12/1992 | Takagi | ................... | 118/728 |
| 5,192,371 A * | 3/1993 | Shuto et al. | ............ | 118/728 |
| 5,326,725 A * | 7/1994 | Sherstinsky et al. | ........ | 438/778 |
| 5,383,971 A * | 1/1995 | Selbrede | ............... | 118/728 |
| 5,474,612 A * | 12/1995 | Sato et al. | ............ | 118/725 |
| 5,569,650 A * | 10/1996 | Watanabe et al. | ........ | 514/43 |
| 5,580,388 A * | 12/1996 | Moore | ............... | 118/728 |
| 5,782,979 A * | 7/1998 | Kaneno et al. | ........ | 118/500 |
| 5,803,977 A * | 9/1998 | Tepman et al. | ........ | 118/728 |
| 5,846,332 A * | 12/1998 | Zhao et al. | ............ | 118/728 |
| 5,951,774 A * | 9/1999 | Shishiguchi et al. | .... | 118/725 |
| 6,048,403 A * | 4/2000 | Deaton et al. | .......... | 118/725 |
| 6,074,696 A * | 6/2000 | Sato | ..................... | 427/248.1 |
| 6,143,086 A * | 11/2000 | Tepman | ............... | 118/728 |
| 6,217,663 B1 * | 4/2001 | Inokuchi et al. | ........ | 118/728 |

(Continued)

FOREIGN PATENT DOCUMENTS

| | | | |
|---|---|---|---|
| EP | 0 448 346 | * 9/1991 | ............ C23C 16/44 |
| JP | 07-245264 A | 9/1995 | |

(Continued)

OTHER PUBLICATIONS

Partial Translation of JP 2011-54639, printed from Jun. 7, 2013.*

*Primary Examiner* — Mary Wilczewski
(74) *Attorney, Agent, or Firm* — Sughrue Mion, PLLC

(57) ABSTRACT

Provided is an apparatus for manufacturing a compound semiconductor by use of metal organic chemical vapor deposition including: a reaction container; a holder on which a formed body is to be placed so that a formed surface of the formed body on which layers of a compound semiconductor are to be formed faces upward, the holder being arranged in the reaction container; and a material supply port supplying a material gas of the compound semiconductor into the reaction container from outside, wherein the holder includes a support member supporting the formed body so that an undersurface of the formed body and a top surface of the holder on which the formed body is to be placed keep a predetermined distance.

9 Claims, 6 Drawing Sheets

(56) References Cited

U.S. PATENT DOCUMENTS

| | | | |
|---|---|---|---|
| 6,435,798 B1 * | 8/2002 | Satoh | 414/217 |
| 6,454,865 B1 * | 9/2002 | Goodman et al. | 118/728 |
| 6,859,616 B2 * | 2/2005 | Kusuda et al. | 392/416 |
| 7,527,694 B2 * | 5/2009 | Sundar | 118/729 |
| 7,654,221 B2 * | 2/2010 | Lubomirsky et al. | 118/52 |
| 7,762,208 B2 * | 7/2010 | Juergensen et al. | 118/503 |
| 8,110,435 B2 * | 2/2012 | Park et al. | 438/104 |
| 2008/0066684 A1 * | 3/2008 | Patalay et al. | 118/728 |
| 2012/0146191 A1 * | 6/2012 | Yasuhara et al. | 257/615 |
| 2013/0049064 A1 * | 2/2013 | Daigo et al. | 257/103 |
| 2013/0055953 A1 * | 3/2013 | Haas et al. | 118/728 |
| 2013/0143393 A1 * | 6/2013 | Yasuhara et al. | 438/478 |

FOREIGN PATENT DOCUMENTS

| | | | | |
|---|---|---|---|---|
| JP | 2002-231713 A | | 8/2002 | |
| JP | 2004-103708 A | | 4/2004 | |
| JP | 2008-91615 A | | 4/2008 | |
| JP | 2008-124127 A | | 5/2008 | |
| JP | 2009-088088 A | | 4/2009 | |
| JP | 2011-54639 | * | 3/2011 | H01L 21/205 |
| JP | 2011-054639 A | | 3/2011 | |

* cited by examiner

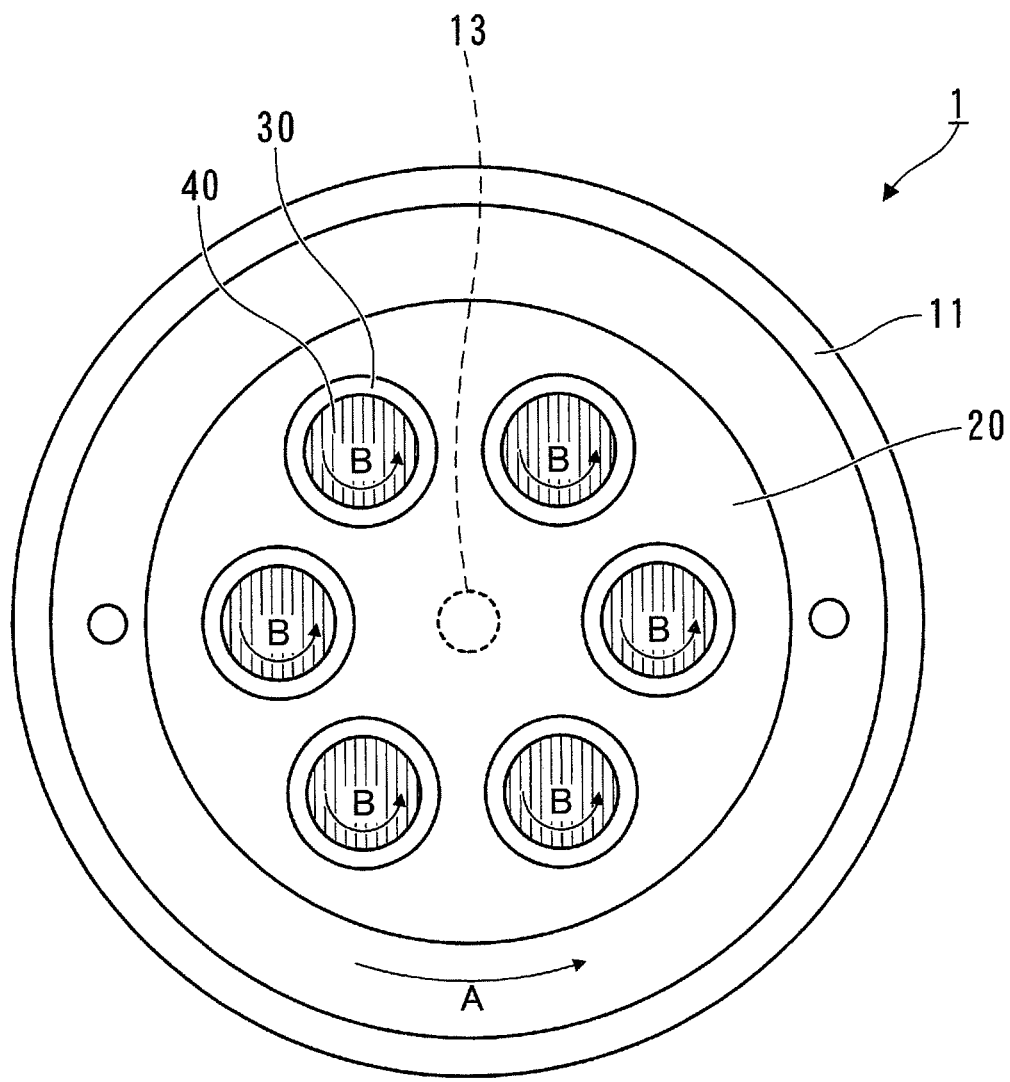

APPARATUS AND METHOD FOR MANUFACTURING COMPOUND SEMICONDUCTOR, AND COMPOUND SEMICONDUCTOR MANUFACTURED THEREBY

BACKGROUND

1. Technical Field

The present invention relates to an apparatus and a method for manufacturing a compound semiconductor, and a compound semiconductor manufactured thereby.

2. Related Art

Conventionally, metal organic chemical vapor deposition (hereinafter, referred to as MOCVD method) is known as one of methods to grow a compound semiconductor crystal.

As an apparatus for manufacturing a compound semiconductor by use of the MOCVD method, Japanese Patent Application Laid-Open Publication No. 2004-103708 describes an apparatus in which plural substrates being growth targets of compound semiconductor crystals are mounted on a holder formed of SiC inside of a reaction tube supplied with a material gas so that each of growth surfaces of the crystals faces upward, and then the holder is rotated to grow the crystals while the substrates are rotated.

In an apparatus for manufacturing a compound semiconductor by use of the MOCVD method, a sapphire substrate and the like are placed on a holder called satellite disc or wafer carrier (in the present specification, both are hereinafter collectively referred to as satellite disc). Then, a crystal of the compound semiconductor generated by a reaction of a material gas introduced into the apparatus is epitaxially grown on the sapphire substrate heated via the satellite disc.

SUMMARY

In such an apparatus for manufacturing a compound semiconductor, if the satellite disc does not contact with the sapphire substrate uniformly, a temperature difference due to a contact condition is generated on the surface of the sapphire substrate on which a crystal of the compound semiconductor is epitaxially grown. This causes a problem of reducing in uniformity of crystal growth of the compound semiconductor. An object of the present invention is to inhibit a change in temperature distribution of a substrate surface on which a crystal of a compound semiconductor is epitaxially grown, in manufacturing the compound semiconductor by use of the MOCVD method.

According to an aspect of the present invention, there is provided an apparatus for manufacturing a compound semiconductor by use of metal organic chemical vapor deposition including: a reaction container; a holder on which a formed body is to be placed so that a formed surface of the formed body on which layers of a compound semiconductor are to be formed faces upward, the holder being arranged in the reaction container; and a material supply port supplying a material gas of the compound semiconductor into the reaction container from outside, wherein the holder includes a support member supporting the formed body so that an undersurface of the formed body and a top surface of the holder on which the formed body is to be placed keep a predetermined distance.

The support member of the holder may be inserted into at least three locations of a circumferential edge of the holder on which the formed body is to be placed. The support member of the holder may be mounted in the form of a ring on a circumferential edge of the holder on which the formed body is to be placed. The support member of the holder may include: a support surface for supporting an outer circumferential edge of the undersurface of the formed body; and an inclined surface configured to form a predetermined angle with respect to the support surface. The support surface of the support member may have such a predetermined height that the top surface of the holder on which the formed body is placed does not come into contact with the undersurface of the formed body supported by the support surface. The support member of the holder may be made of a material having a coefficient of thermal conductivity of 10 W/(m·K) or less. The support member of the holder may be made of one selected from the group consisting of alumina ($Al_2O_3$), silicon nitride ($Si_3N_4$), silica glass ($SiO_2$) and zirconia ($ZrO_2$). The compound semiconductor may be a group III nitride semiconductor.

According to another aspect of the present invention, there is provided a method for manufacturing a compound semiconductor in a reaction container by use of metal organic chemical vapor deposition. The method includes the steps of: arranging a support member on a holder, and further placing a formed body so that a formed surface of the formed body on which layers of a compound semiconductor are to be formed through epitaxial growth faces upward and that a back surface of the formed body does not come into contact with a top surface of the holder, the support member supporting the formed body and inhibiting heat conduction from the holder to an outer circumferential side surface of the formed body; installing the holder having the formed body placed thereon in the reaction container so as to be rotatable; and supplying a material gas of the compound semiconductor into the reaction container in which the holder is installed.

The formed body may be placed on the support member inserted into at least three locations of a circumferential edge of the holder. The support member may be mounted in the form of a ring on a circumferential edge of the holder on which the formed body is to be placed. The support member may be made of a material having a coefficient of thermal conductivity of 10 W/(m·K) or less. The support member may be made of one selected from the group consisting of alumina ($Al_2O_3$), silicon nitride ($Si_3N_4$), silica glass ($SiO_2$) and zirconia ($ZrO_2$). The formed body may be placed on the support member so that the outer circumferential side surface thereof does not come into contact with the support member. The formed body may be heated between 700 degrees C. and 1200 degrees C., both inclusive. The compound semiconductor may be a group III nitride semiconductor.

According to still another aspect of the present invention, there is provided a compound semiconductor manufactured by the above-described method.

BRIEF DESCRIPTION OF THE DRAWINGS

Exemplary embodiment(s) of the present invention will be described in detail based on the following figures, wherein:

FIG. 2 is a plan view showing a cross-sectional view of the MOCVD apparatus shown in FIG. 1, taken along a line II-II;

DETAILED DESCRIPTION

Hereinafter, a description will be given of an exemplary embodiment of the present invention. Note that the present invention is not limited to the following exemplary embodiment and may be implemented with various modifications within its scope. In addition, the drawings to be used are illustrative for illustrating the exemplary embodiment, and do not show actual dimensions.

<MOCVD Apparatus>

Figure 1:
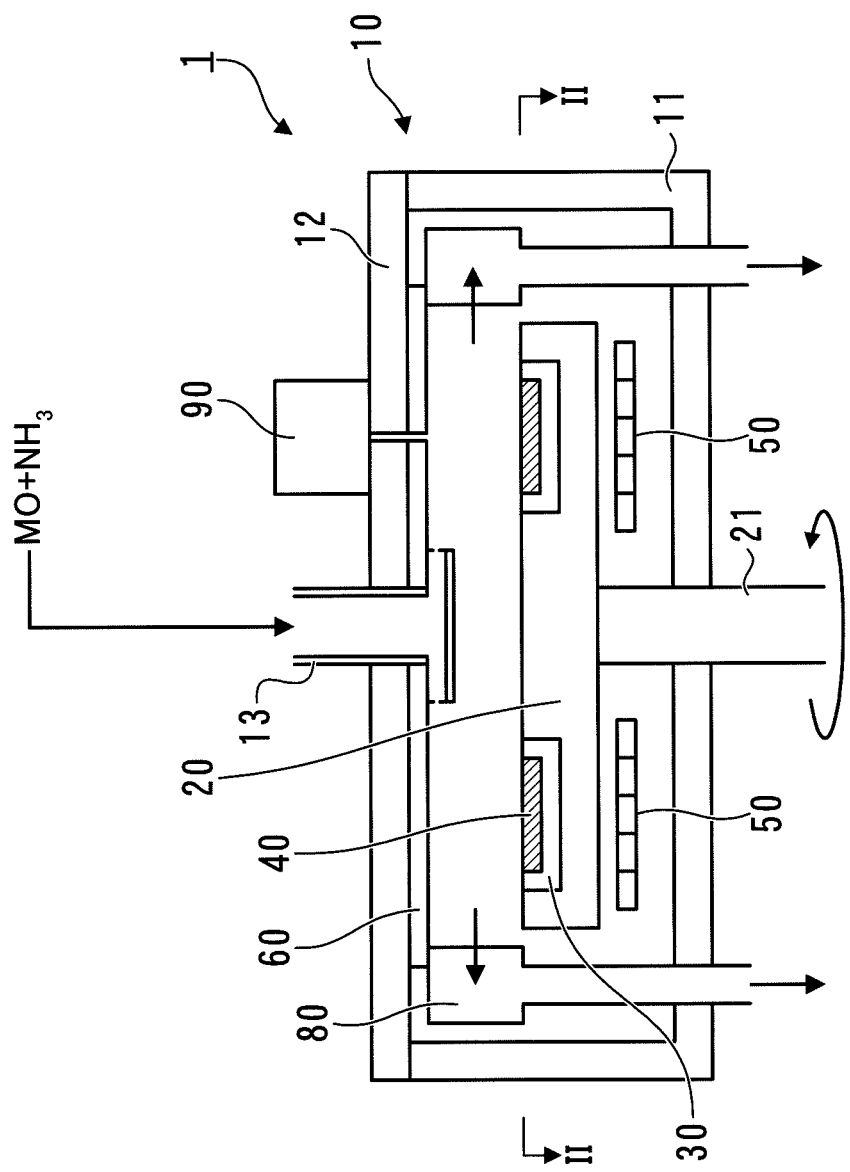
FIG. 1 is an exemplary schematic diagram showing a cross-sectional configuration of an MOCVD (Metal Organic Chemical Vapor Deposition) apparatus.

FIG. 1 is a diagram showing a cross-sectional configuration of an MOCVD (metal organic chemical vapor deposition) apparatus 1. FIG. 2 is a cross-sectional view of the MOCVD apparatus 1 shown in FIG. 1, taken along a line II-II.

The MOCVD apparatus 1 allows for arbitrary selection from substrates 110 (see FIG. 5 to be described later) for epitaxially growing a group III nitride semiconductor crystal and compound semiconductor substrates (compound semiconductor substrates 40 to be described later are also listed as an example thereof, and these may be referred to as formed body in this specification.) composed by forming in advance at least one compound semiconductor layer having an arbitrary composition further on each substrate 110. The MOCVD apparatus 1 has a so-called vertical configuration in which, for example, when the compound semiconductor substrates 40 are used, the compound semiconductor substrates 40 are arranged with crystal growth surfaces thereof facing upward and a material gas being a material of crystals to be epitaxially grown is supplied from above the compound semiconductor substrates 40.

The MOCVD apparatus 1 includes: a reaction container 10 in which a reaction chamber is formed; and a support 20 arranged in the reaction chamber of the reaction container 10. The reaction container 10 includes: a container 11 that has a cylindrical shape, is provided with an aperture facing upward and contains the support 20 therein; and a lid portion 12 that has a disc shape and is attached to an upper portion of the container 11.

The container 11 and the lid portion 12 are composed of metal such as stainless steel. The lid portion 12 is attached so as to be openable and closable with respect to the container 11, and forms the reaction chamber together with the container 11 when closed with respect to the container 11. A seal member, such as an o-ring (not shown), is attached to a region where the container 11 and the lid portion 12 face each other.

A through-hole to supply a material gas into the reaction chamber from a gas supply mechanism (not shown) provided outside is formed at the center of the lid portion 12. A supply pipe 13 is connected to the through-hole. A through-hole to observe the inside of the reaction chamber from outside is also formed at a position apart from the center of the lid portion 12.

Plural exhaust pipes to exhaust the material gas having supplied into the reaction chamber to the outside of the reaction chamber are formed to penetrate in the bottom of the container 11. A through-hole for a shaft 21 described later to run through is formed in the center of the bottom of the container 11.

The support 20 has a disc shape, and is arranged in the container 11 so that one surface (the front surface) faces upward and the other surface (the back surface) faces downward. The support 20 is composed of a base material formed of carbon (C) with a coating of silicon carbide (SiC) applied to the outside thereof. On the front surface side of the support 20, six concave portions each having a circular shape are formed at regular intervals in a circumferential direction. On the back surface side of the support 20, the metallic shaft 21 extending downward from the center of the support 20 is attached. The shaft 21 protrudes to the outside of the reaction container 10 through the through-hole provided in the center of the bottom of the container 11. The support 20 rotates in the direction of an arrow A shown in FIG. 2 by drive force applied to the shaft 21 from the outside of the reaction container 10. Inside of the support 20, a gas supply port (not shown) for supplying nitrogen $N_2$ toward the bottoms of the six concave portions provided in the support 20 are formed.

Substrate holders 30, each of which is an example of a holder and has a circular shape, are attached to the six concave portions provided in the front surface of the support 20. Each of the substrate holders 30 has a circular-shaped concave portion formed in the surface facing upward. The compound semiconductor substrates 40 are attached to the respective concave portions. Clearance is formed between the concave portions provided in the support 20 and the respective substrate holders 30. These six substrate holders 30 are attachable and detachable to and from the support 20.

Each of the compound semiconductor substrates 40, as an example of a formed body, is held in the concave portion of the substrate holder 30 so that a crystal growth surface thereof (a formed surface of crystals) is exposed to the outside. The compound semiconductor substrates 40 are attachable and detachable to and from the respective substrate holders 30. The substrate holders 30 rotate in the direction of arrows B shown in FIG. 2, while holding the respective compound semiconductor substrates 40, by a flow of nitrogen $N_2$ supplied through through-hole (not shown).

A heating unit 50 is provided between the back surface side of the support 20 and the bottom of the container 11 of the MOCVD apparatus 1. The heating unit 50 heats the compound semiconductor substrates 40 through the support 20 and the substrate holders 30. The heating unit 50 has a ring shape with a hole to penetrate the shaft 21 formed therein, and contains a coil therein. The heating unit 50 heats the carbon composing the support 20 through electromagnetic induction by a current being supplied to the coil.

A protection member 60 is provided below the lid portion 12 and above the support 20 in the MOCVD apparatus 1. The protection member 60 prevents products produced by a reaction of the material gas supplied into the reaction chamber from adhering and depositing on the inner wall of the lid portion 12, thereby to protect the lid portion 12. The protection member 60 has a circular shape, and includes a through-hole formed at the center thereof for supplying the material gas into the reaction chamber from outside, as with the lid portion 12. The protection member 60 also includes a through-hole formed therein to observe the inside of the reaction chamber from outside, as with the lid portion 12.

An exhaust member 80 is attached between the support 20 and the protection member 60 of the MOCVD apparatus 1. The exhaust member 80 guides the material gas and the like having been supplied into the reaction chamber and used for epitaxial growth of crystals toward exhaust pipes provided in the bottom of the container 11. The exhaust member 80 has a ring shape. The inner wall of the exhaust member 80 is located further outside as compared with the six concave portions provided in the support 20. Plural through-holes (not shown) to exhaust the used material gas and the like to the outside are formed in the inner wall of the exhaust member 80. The exhaust member 80 is configured so as not to prevent the support 20 from rotating at a portion facing an edge of an outer circumferential portion of the support 20. In FIG. 2, illustration of the exhaust member 80 is omitted.

A monitor 90 is attached above the through-hole provided in the lid portion 12 of the MOCVD apparatus 1. The monitor 90 monitors the state of the inside of the reaction chamber, specifically, the state of crystals epitaxially growing on the compound semiconductor substrates 40 held by the support 20 through the substrate holders 30 and the state of a warp or the like of the compound semiconductor substrates 40, through the through-holes respectively provided in the lid portion 12 and in the protection member 60. In order to prevent the material gas and the like from flowing into the monitor 90 through the through-holes, a purge gas, such as nitrogen $N_2$, for example, is supplied from the monitor 90 toward the reaction chamber.

<Substrate Holder>

Figure 3A:
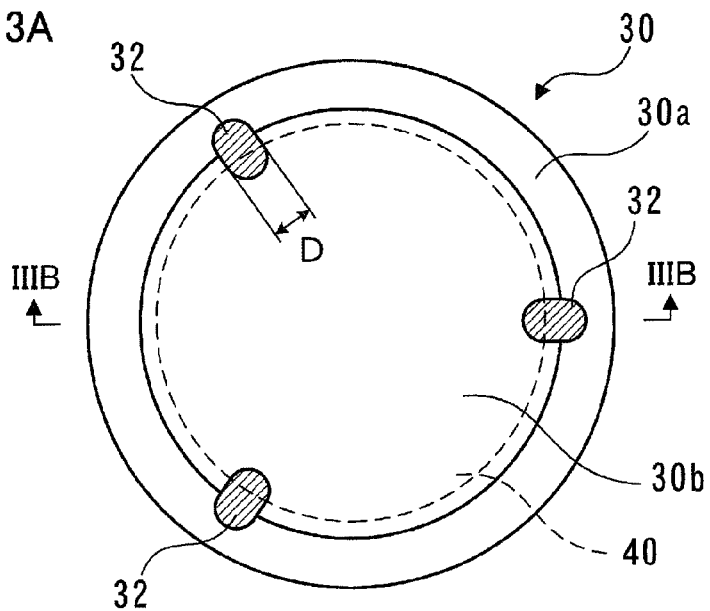
FIG. 3A is a top view of the substrate holder on which support members each having a piece-like shape are mounted.
Figure 3B:
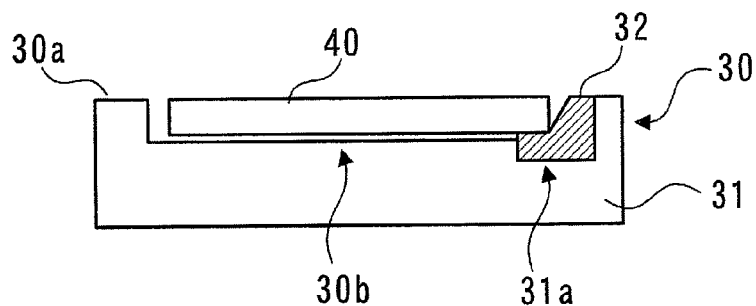
FIG. 3B is a cross-sectional view of FIG. 3A taken along a line IIIB-IIIB, in a case where the compound semiconductor substrate is placed thereon.
Figure 3C:
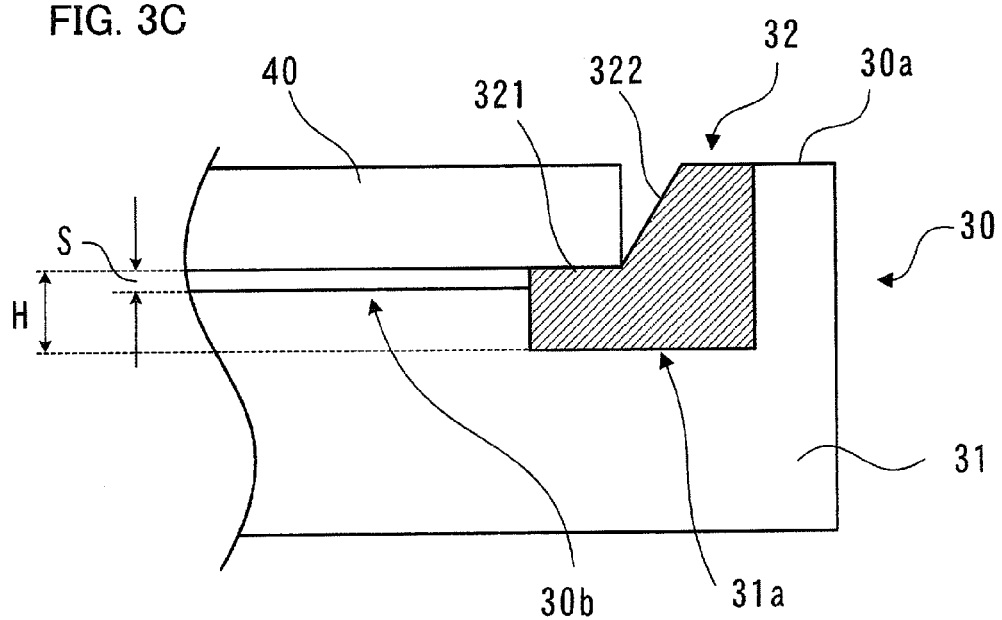
FIG. 3C is an enlarged cross-sectional view of a part at which the support member of FIG. 3B is mounted.

FIGS. 3A to 3C are views for illustrating a configuration of the substrate holders 30 used in the above-described MOCVD apparatus 1. FIG. 3A is a top view of the substrate holder 30 on which support members 32 each having a piece-like shape are mounted. FIG. 3B is a cross-sectional view of FIG. 3A taken along a line IIIB-IIIB, in a case where the compound semiconductor substrate 40 is placed thereon. FIG. 3C is an enlarged cross-sectional view of a part at which the support member 32 of FIG. 3B is mounted. In FIG. 3A, the compound semiconductor substrate 40 (see FIG. 2) placed on the substrate holder 30 is shown with a broken line.

As shown in FIG. 3A, the substrate holder 30, which is an example of a holder, includes: a base portion 30a having a circular shape; and a concave portion 30b formed at the center on the front surface side of the base portion 30a. The concave portion 30b has a circular shape, and the bottom thereof is flat. The diameter of the concave portion 30b is defined as slightly larger than that of the compound semiconductor substrate 40.

The substrate holder 30 has a body portion 31. In the present exemplary embodiment, the body portion 31 is composed of silicon carbide (SiC). A coating composed of silicon nitride ($Si_3N_4$) may be provided on the outer side surface in the circumferential direction of the body portion 31 and on the back surface thereof.

The support members 32 each having a piece-like shape are inserted at three locations into the circumferential edge of the concave portion 30b of the substrate holder 30 so as to keep substantially equal distances with each other along the circumferential edge. As will be descried later, the compound semiconductor substrate 40 placed on the substrate holder 30 is supported by the three support members 32 so that the top surface of the concave portion 30b formed at the center on the front surface side of the base portion 30a does not come into contact with the undersurface of the compound semiconductor substrate 40. The width D of each support member 32 is not particularly limited. However, it is in a range of 1 mm to 5 mm, and preferably in a range of 2 mm to 4 mm. In the present exemplary embodiment, the width D of each support member 32 is 3 mm.

As shown in FIG. 3B, a groove 31a into which the support members 32 are inserted is formed at the circumferential edge of the concave portion 30b of the substrate holder 30. The groove 31a is formed so as to be spread over a part of the inner side of the base portion 30a having a circular shape and a part of the circumferential edge of the concave portion 30b formed at the center on the front surface side of the base portion 30a. The compound semiconductor substrate 40 is supported at the three locations in the circumferential edge thereof by the support members 32, and thereby is placed on the substrate holder 30 without contacting the top surface of the concave portion 30b.

As shown in FIG. 3C, each of the support members 32 has a support surface 321 supporting the outer circumferential edge of the undersurface of the compound semiconductor substrate 40; and an inclined surface 322 forming a predetermined angle with respect to the support surface 321. The inclined surface 322 is inclined so that the height relative to the groove 31a gradually increases toward the inner side of the base portion 30a of the body portion 31 into which the support members 32 are inserted.

The support surface 321 of the support member 32 is formed with a predetermined height H relative to the groove 31a so that the top surface of the concave portion 30b of the substrate holder 30 does not come into contact with the undersurface of the compound semiconductor substrate 40. The top surface of the concave portion 30b of the substrate holder 30 and the undersurface of the compound semiconductor substrate 40 keep a predetermined distance S from each other.

In the present exemplary embodiment, the height H of the support surface 321 of the support member 32 relative to the groove 31a is not particularly limited. However, it is in a range of 0.5 mm to 3 mm, and preferably in a range of 1 mm to 2 mm. The distance S between the top surface of the concave portion 30b of the substrate holder 30 and the undersurface of the compound semiconductor substrate 40 is not particularly limited. However, it is in a range of 50 μm to 500 μm, and preferably in a range of 100 μm to 300 p.m.

The material composing the support members 32 is preferably those which have a coefficient of thermal conductivity is 10 W/(m·K) or less at a temperature for epitaxial growth. For example, listed are alumina ($Al_2O_3$), silicon nitride ($Si_3N_4$), silica glass ($SiO_2$), zirconia ($ZrO_2$), and the like. Among these, silica glass ($SiO_2$) and zirconia ($ZrO_2$) have particularly low thermal conductivity, allowing for exceptional inhibition of heat conduction between the compound semiconductor substrate 40 and the substrate holder 30.

As shown in FIG. 3C, the bottom of the outer circumferential edge of the compound semiconductor substrate 40 is supported by the support surfaces 321 of the support members 32. Thus, using the support members 32 made of silica glass ($SiO_2$) leads to reduction in heat conduction from the substrate holder 30 to the compound semiconductor substrate 40.

Additionally, the lower corner portion of the outer circumferential side surface of the compound semiconductor substrate 40 has line contact with the inclined surface 322 that is configured to form a predetermined angle with respect to the support surface 321. This leads to avoidance of contact heat transfer from the substrate holder 30 to the outer circumferential side surface of the compound semiconductor substrate 40, and thus leads to inhibition in heat conduction between the outer circumferential side surface of the compound semiconductor substrate 40 and the substrate holder 30.

In the present exemplary embodiment, as described above, the compound semiconductor substrate 40 is supported at the three locations in the circumferential edge thereof by the support members 32, and thereby is placed on the substrate holder 30 without contacting the top surface of the concave portion 30b. This decreases the contact area between the compound semiconductor substrate 40 and the substrate holder 30. Furthermore, the outer circumferential side surface of the compound semiconductor substrate 40 has line contact with the inclined surface 322. This inhibits heat conduction between the outer circumferential side surface of the compound semiconductor substrate 40 and the substrate holder 30, and also inhibits a temperature change around the contact portion.

(Second Exemplary Embodiment of Support Member)

Figure 4A:
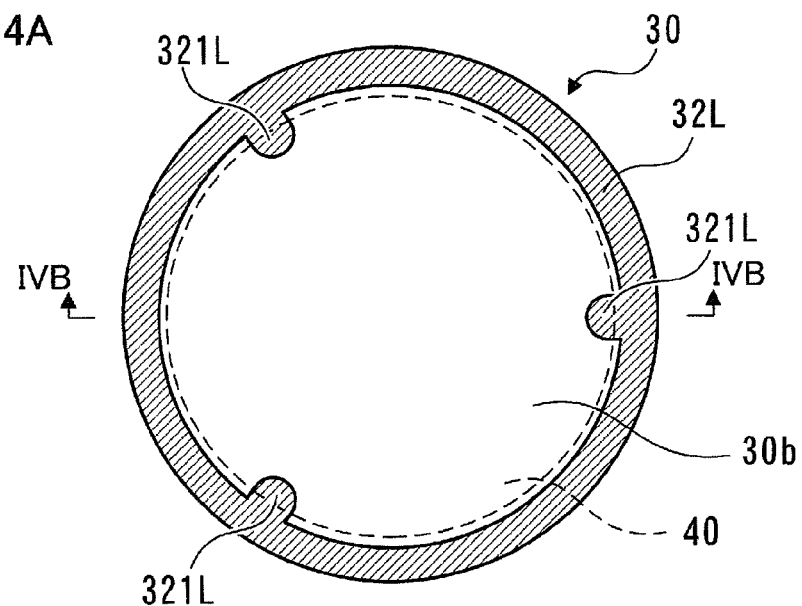
FIG. 4A is a top view of the substrate holder on which a ring-shaped support member is mounted.
Figure 4B:
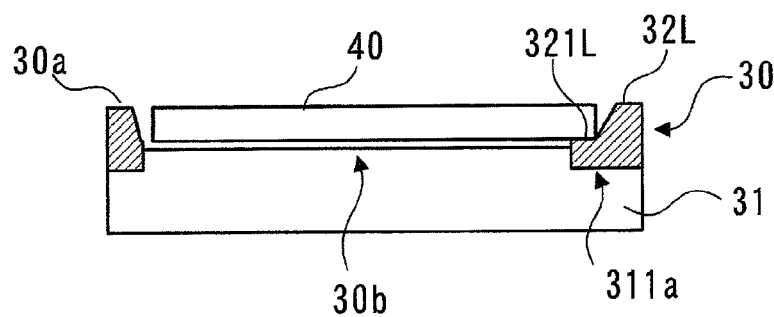
FIG. 4B is a cross-sectional view of FIG. 4A taken along a line IVB-IVB, in a case where the compound semiconductor substrate is placed thereon.
Figure 4C:
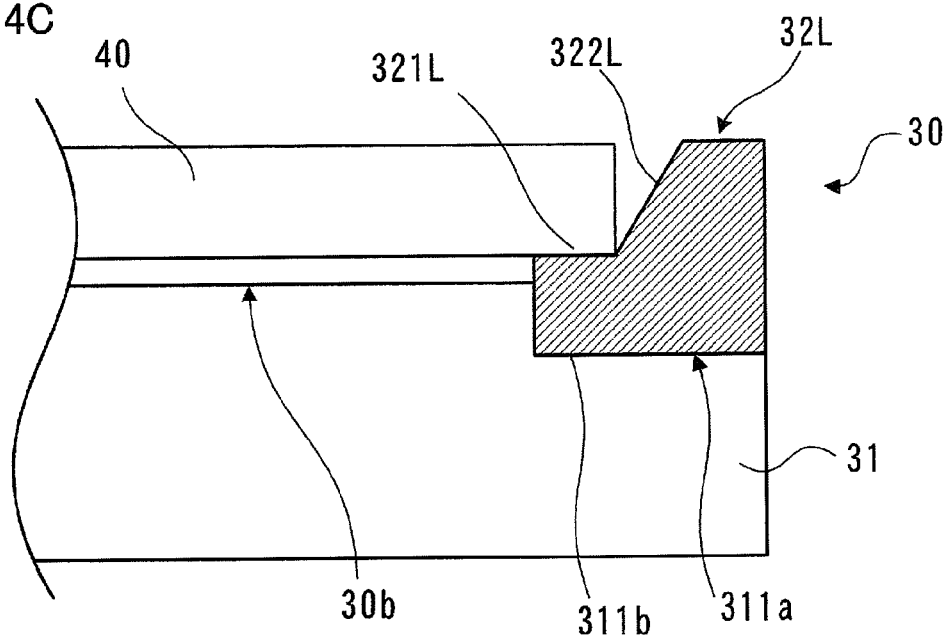
FIG. 4C is an enlarged cross-sectional view of a part at which the support member of FIG. 4B is mounted.

FIGS. 4A to 4C are views for illustrating a configuration of the substrate holders 30 of the second exemplary embodiment used in the above-described MOCVD apparatus 1. FIG. 4A is a top view of the substrate holder 30 on which a support member 32L having a ring shape is mounted. FIG. 4B is a cross-sectional view of FIG. 4A taken along a line IVB-IVB, in a case where the compound semiconductor substrate 40 is placed thereon. FIG. 4C is an enlarged cross-sectional view of a part at which the support member 32L of FIG. 4B is mounted. The same reference numerals are used for the same components as those in FIGS. 3A to 3C, and the description thereof is omitted. In FIG. 4A, the compound semiconductor substrate 40 (see FIG. 2) placed on the substrate holder 30 is shown with a broken line.

As shown in FIG. 4A, the ring-shaped support member 32L is mounted on the circumferential edge of the concave portion 30b of the substrate holder 30. The ring-shaped support member 32L has support surfaces 321L formed so as to project toward the center of the concave portion 30b. The support surfaces 321L are formed at three locations along the inner circumferential surface of the ring-shaped support member 32L so as to keep substantially equal distances with each other. As will be descried later, the compound semiconductor substrate 40 is supported by the support surfaces 321L at the three locations so that the top surface of the concave portion 30b formed at the center on the front surface side of the base portion 30a does not come into contact with the undersurface of the compound semiconductor substrate 40.

As shown in FIG. 4B, an annular groove 311a into which the ring-shaped support member 32L is inserted is formed at the circumferential edge of the concave portion 30b of the substrate holder 30. The groove 311a is formed by cutting the circumferential edge of the substrate holder 30, so as to have a level difference with respect to the concave portion 30b formed at the center part of the substrate holder 30. The compound semiconductor substrate 40 is supported at the three locations in the circumferential edge thereof by the support surfaces 321L of the support member 32L, and thereby is placed on the substrate holder 30 without contacting the top surface of the concave portion 30b.

As shown in FIG. 4C, the annular groove 311a formed at the circumferential edge of the concave portion 30b of the substrate holder 30 is further provided with fitting portions 311b into which the support surfaces 321L at the three locations formed on the ring-shaped support member 32L are respectively inserted. The fitting portions 311b are formed by cutting inwardly from the circumferential edge of the concave portion 30b toward the center thereof, in accordance with the shape of the support surfaces 321L of the support member 32L.

Additionally, the ring-shaped support member 32L has the support surfaces 321L supporting the outer circumferential edge of the undersurface of the compound semiconductor substrate 40; and inclined surfaces 322L forming a predetermined angle with respect to the support surfaces 321L. The inclined surfaces 322L are inclined so that the height relative to the groove 311a gradually increases toward the outer side of the body portion 31 into which the support member 32L is inserted.

As shown in FIG. 4C, the bottom of the outer circumferential edge of the compound semiconductor substrate 40 is supported by the support surfaces 321L of the support member 32L made of silica glass ($SiO_2$).

Additionally, the lower corner portion of the outer circumferential side surface of the compound semiconductor substrate 40 has line contact with each inclined surface 322L that is configured to form a predetermined angle with respect to the support surface 321L. This leads to avoidance of contact heat transfer from the substrate holder 30 to the outer circumferential side surface of the compound semiconductor substrate 40, and thus leads to inhibition in heat conduction between the outer circumferential side surface of the compound semiconductor substrate 40 and the substrate holder 30. Especially, in the present exemplary embodiment, since the groove 311a is formed by cutting the circumferential edge of the substrate holder 30, the outer circumferential edge of the ring-shaped support member 32L does not come into contact with the substrate holder 30. This enhances the effect of thermally insulating the outer circumferential side surface of the compound semiconductor substrate 40 from the substrate holder 30.

The support member 32L and the support surfaces 321L may not be integrally formed with each other. For example, a ring-shaped support member into which piece-like support members having support surfaces are inserted may be used. In this case, the divided support member decreases thermal conductivity, resulting in further inhibition in heat conduction between the outer circumferential side surface of the compound semiconductor substrate 40 and the substrate holder 30.

<Material Gas>

In the present exemplary embodiment, the MOCVD apparatus 1 is used to form compound semiconductor layers having an arbitrary composition on each of the substrates 110 (see FIG. 5) in advance and further to form group III nitride semiconductor layers on each of the resultant compound semiconductor substrates 40. Organic metal including a group III element and ammonia $NH_3$ including nitrogen are used as the material. Since organic metal is primarily a liquid material, liquid organic metal is subjected to bubbling with nitrogen $N_2$ or hydrogen $H_2$, and a resultant organometallic (MO) gas composed of a mixture of the organic metal and nitrogen $N_2$ or hydrogen $H_2$ is supplied as the material gas. In the present exemplary embodiment, the organometallic (MO) gas and ammonia $NH_3$ are supplied form the supply pipe 13.

As the organic metal, listed are: an organic gallium compound such as trimethylgallium (TMG) or triethylgallium (TEG); an organic aluminum compound such as trimethylaluminum (TMA) or triethylaluminium (TEA); and an organic indium compound such as trimethylindium (TMI) or triethylindium (TEI), for example.

Examples of a material of n-type dopant include: a silane compound such as monosilane ($SiH_4$) or disilane ($Si_2H_6$); and a germanium compound such as germane gas ($GeH_4$), tetramethylgermanium (($CH_3$)$_4$Ge) or tetraethylgermanium (($C_2H_5$)$_4$Ge).

Examples of a material of p-type dopant include: an organic magnesium compound such as biscyclopentadienylmagnesium ($Cp_2Mg$) or bisethylcyclopentadienylmagnesium ($EtCp_2Mg$).

Hydrazine ($N_2H_4$) may be used instead of ammonia. Note that, besides the above-mentioned organic metal MO, a composition containing another group III element may be employed, and dopant, such as Ge, Si, Mg, Ca, Zn and Be, may be contained as necessary. Additionally, not only an intentionally added element, but also impurities necessarily included depending on a condition or the like of film formation and a small quantity of impurities included in a raw material or a material of a reaction tube may be included.

<Multilayer Semiconductor Wafer>

Figure 5:
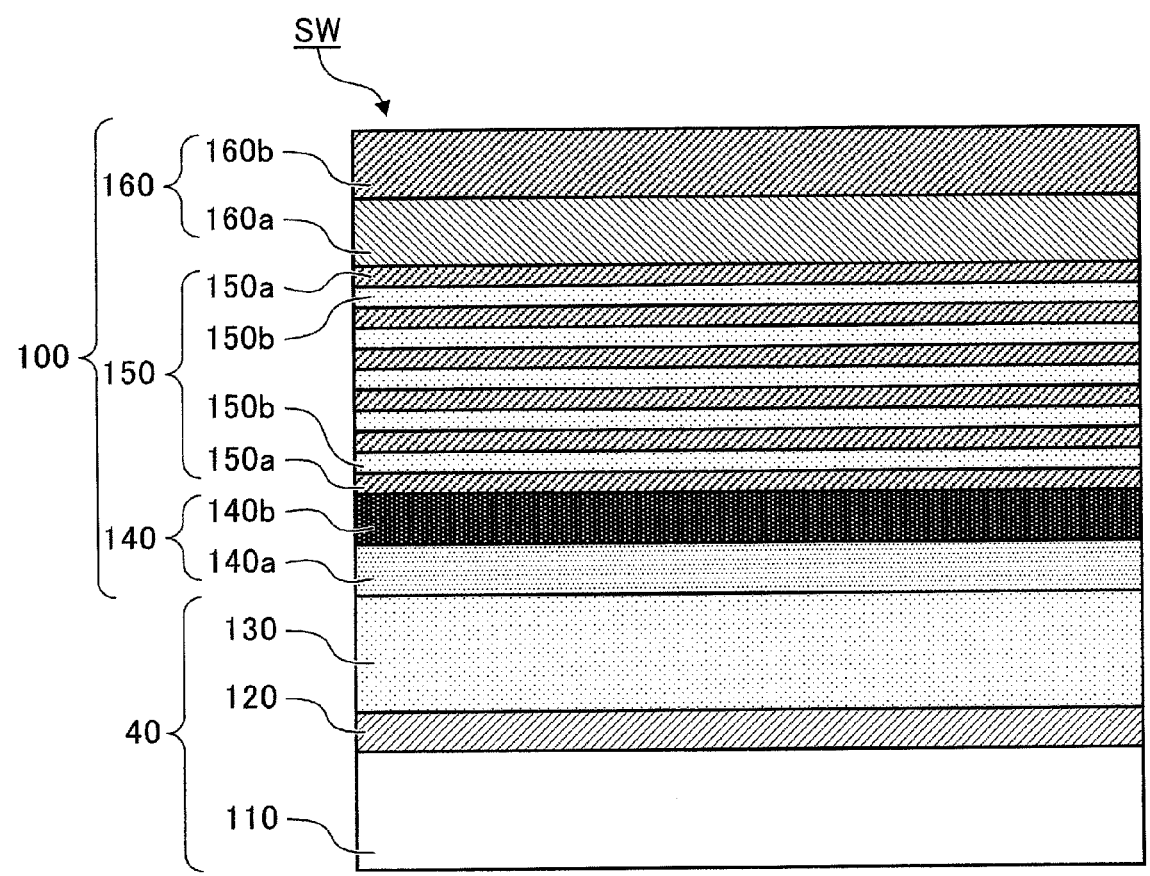
FIG. 5 is an exemplary cross-sectional view of a multilayer semiconductor wafer manufactured by using the MOCVD apparatus.

FIG. 5 shows a cross-sectional view of an example of a multilayer semiconductor wafer SW manufactured by using the MOCVD apparatus 1. Note that a compound semiconductor composing the multilayer semiconductor wafer SW is not particularly limited, and a III-V compound semiconductor, a II-VI compound semiconductor, a IV-IV compound semiconductor and the like are listed as examples thereof. In the present exemplary embodiment, a III-V compound semiconductor is preferable, and a group III nitride semiconductor is more preferable. Hereinafter, a multilayer semiconductor wafer SW having a group III nitride semiconductor will be described as an example.

The multilayer semiconductor wafer SW includes a substrate 110, an intermediate layer 120 formed on the substrate 110, and a base layer 130, an n-type semiconductor layer 140, a light-emitting layer 150 and a p-type semiconductor layer 160 which are sequentially layered on the intermediate layer 120. In the present exemplary embodiment, a substrate 110 having an intermediate layer 120 and a base layer 130 sequentially layered thereon is referred to as compound semiconductor substrate 40.

The n-type semiconductor layer 140 includes: an n-type contact layer 140a provided on the base layer 130 side; and an n-type clad layer 140b provided on the light-emitting layer 150 side. The light-emitting layer 150 has barrier layers 150a and well layers 150b alternately layered, and has a structure in which two barrier layers 150a sandwiches one well layer 150b. The p-type semiconductor layer 160 includes: a p-type clad layer 160a provided on the light-emitting layer 150 side; and a p-type contact layer 160b provided at the uppermost layer. In the following description, the n-type semiconductor layer 140, the light-emitting layer 150 and the p-type semiconductor layer 160 will be collectively referred to as compound semiconductor layers 100.

(Substrate 110)

The substrate 110 is composed of a material different from a group III nitride semiconductor. On the substrate 110, group III nitride semiconductor crystals are epitaxially grown. Listed as examples of a material composing the substrate 110 are: sapphire, silicon carbide (SiC), silicon, zinc oxide, magnesium oxide, manganese oxide, zirconium oxide, zinc iron manganese oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, and the like. Among these materials, sapphire and silicon carbide are preferable. In the present exemplary embodiment, sapphire is used for the substrate 110.

(Intermediate Layer 120)

Since the substrate 110 is composed of a material different from a group III nitride semiconductor, it is preferable to provide the intermediate layer 120 having a buffer function on the substrate 110. If a film of the intermediate layer 120 having a single crystal structure is formed on the substrate 110, the buffer function of the intermediate layer 120 effectively works, and films of the base layer 130 and the compound semiconductor layers 100 formed on the intermediate layer 120 become crystal films having excellent crystallinity. It is preferable for the intermediate layer 120 to contain Al, and is particularly preferable to contain MN, which is a group III nitride semiconductor.

(Base Layer 130)

As a material for the base layer 130, a group III nitride semiconductor including Ga (a GaN-based compound semiconductor) is used. In particular, AlGaN or GaN is preferable. In the present specification, the composition ratio of each element is sometimes omitted to use notation such as AlGaN and GaInN. The film thickness of the base layer 130 is 0.1 µm or more, preferably 0.5 µm or more, and more preferably 1 µm or more.

(N-type Semiconductor Layer 140)

The n-type semiconductor layer 140 is composed of the n-type contact layer 140a and the n-type clad layer 140b. As the n-type contact layer 140a, a GaN-based compound semiconductor is used, similarly to the base layer 130. It is preferable that the gallium nitride-based compound semiconductor composing the base layer 130 have the same composition as the one composing the n-type contact layer 140a. The total film thickness of the base layer 130 and the n-type contact layer 140a is preferably set in a range of 0.1 µm to 20 µm, preferably in a range of 0.5 µm to 15 µm, and more preferably in a range of 1 µm to 12 µm.

The n-type clad layer 140b is formed of AlGaN, GaN, GaInN or the like. A structure obtained by heterojunction of structures of these compounds or a superlattice structure obtained by layering structures of these compounds several times may be employed. If GaInN is employed as the n-type clad layer 140b, it is desirable that the band gap thereof be set larger than that of the GaInN of the light-emitting layer 150. The film thickness of the n-type clad layer 140b is preferably in a range of 5 nm to 500 nm, and more preferably in a range of 5 nm to 100 nm.

(Light-Emitting Layer 150)

The light-emitting layer 150 includes the barrier layers 150a composed of a gallium nitride-based compound semiconductor and the well layers 150b composed of a gallium nitride-based compound semiconductor containing indium, these layers being alternately and repeatedly layered. In addition, the light-emitting layer 150 is formed by layering in such an order that the barrier layers 150a are disposed on the n-type semiconductor layer 140 side and the p-type semiconductor layer 160 side. In the present exemplary embodiment, the light-emitting layer 150 has the following configuration: six barrier layers 150a and five well layers 150b are alternately and repeatedly layered; the barrier layers 150a are disposed at the uppermost layer and the lowermost layer of the light-emitting layer 150; and each well layer 150b is disposed between one barrier layer 150a and the next.

For the well layers 150b, gallium indium nitride, such as $Ga_{1-s}In_sN$ (where $0<s<0.4$), for example, can be used as the gallium nitride-based compound semiconductor containing indium.

For the barrier layers 150a, a gallium nitride-based compound semiconductor, such as $Al_cGa_{1-c}N$ (where $0 \le c \le 0.3$) or the like, having larger band gap energy than the well layers 150b composed of a gallium nitride-based compound semiconductor containing indium, for example, can be preferably used.

(P-type Semiconductor Layer 160)

The p-type semiconductor layer 160 is composed of the p-type clad layer 160a and the p-type contact layer 160b. For the p-type clad layer 160a, $Al_dGa_{1-d}N$ (where $0<d\leq0.4$) is preferably taken as an example. The film thickness of the p-type clad layer 160a is preferably in 1 nm to 400 nm, and more preferably in 5 nm to 100 nm.

For the p-type contact layer 160b, a gallium nitride-based compound semiconductor layer including $Al_eGa_{1-e}N$ (where $0\leq e<0.5$) is taken as an example. The film thickness of the p-type contact layer 160b is not particularly limited, but is preferably in 10 nm to 500 nm, and more preferably in 50 nm to 200 nm.

The compound semiconductor substrate 40 is manufactured as follows. First, substrates 110 made of sapphire and having a predetermined diameter and a predetermined thickness are set in a sputtering apparatus (not shown). Then, in the sputtering apparatus, a gas including a group V element and a metal material are activated by plasma to react with each other, thereby to form the intermediate layer 120 composed of a group III nitride semiconductor on each substrate 110. Subsequently, each substrate 110 on which the intermediate layer 120 is formed is set in the MOCVD apparatus 1 shown in FIG. 1. Specifically, each substrate 110 is set in the corresponding substrate holder 30 so that the intermediate layer 120 faces outside, and each substrate holder 30 in which the substrate 110 is set is arranged in the corresponding concave portion provided in the support 20 so that the intermediate layer 120 faces upward. Then, the base layer 130 is formed on each intermediate layer 120 by using the MOCVD apparatus 1. Thereby, the compound semiconductor substrates 40 are obtained.

Figure 6:
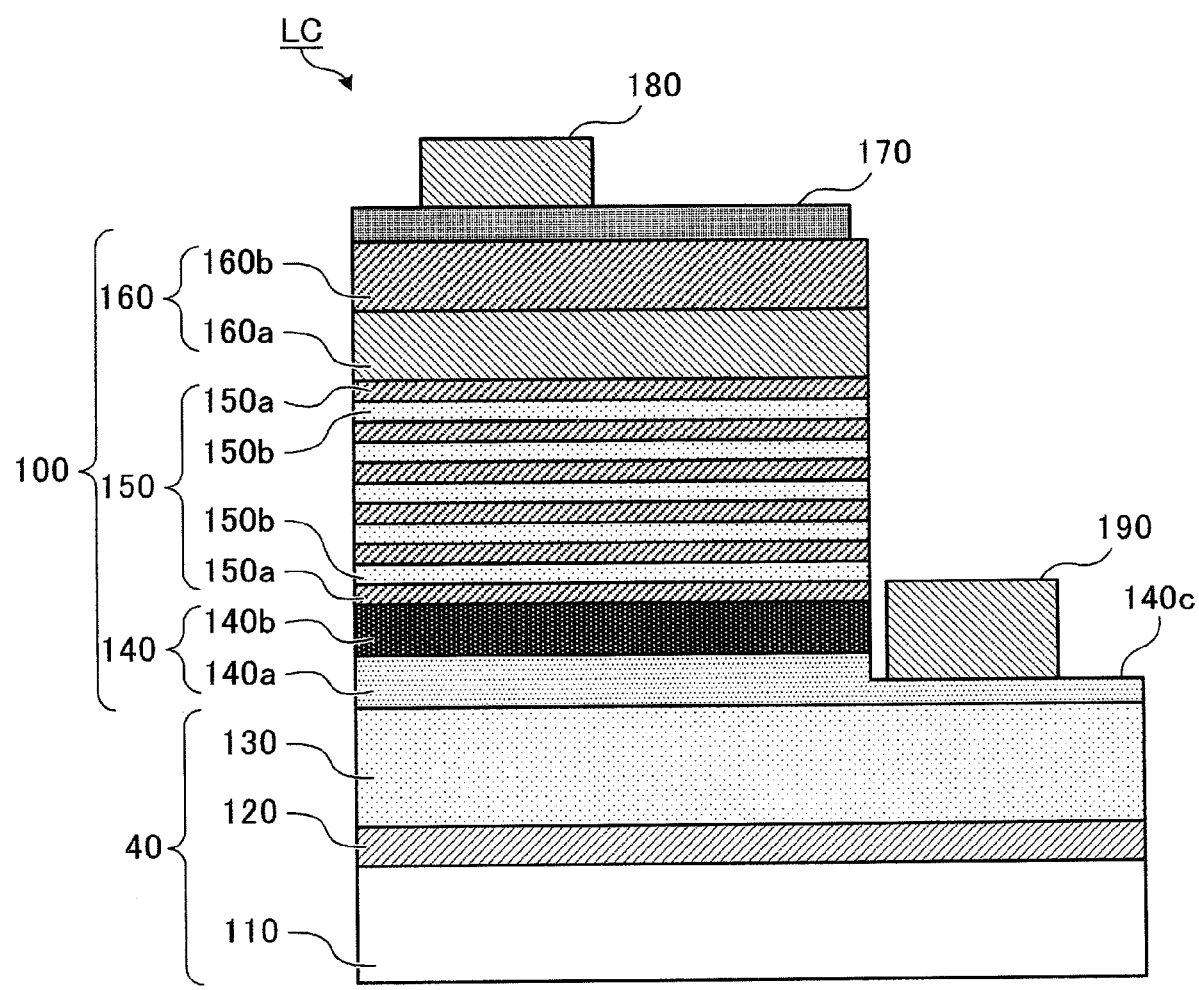
FIG. 6 is an exemplary cross-sectional view of a light-emitting device chip obtained by further processing on the multilayer semiconductor wafer.

FIG. 6 shows a cross-sectional view of a light-emitting device chip LC obtained by further processing on the multilayer semiconductor wafer SW.

In the light-emitting device chip LC, a transparent positive electrode 170 is layered on the p-type contact layer 160b of the p-type semiconductor layer 160, and a positive electrode bonding pad 180 is further formed on the transparent positive electrode 170. Additionally, a negative electrode bonding pad 190 is layered on an exposed region 140c formed in the n-type contact layer 140a of the n-type semiconductor layer 140.

(Transparent Positive Electrode 170)

Listed as examples of a material composing the transparent positive electrode 170 are: ITO ($In_2O_3$—$SnO_2$), AZO (ZnO—$Al_2O_3$), IZO ($In_2O_3$—ZnO), GZO (ZnO—$Ga_2O_3$), and the like, which are conventionally known materials. The structure of the transparent positive electrode 170 is not particularly limited, and a conventionally known structure can be employed. The transparent positive electrode 170 may be formed so as to cover almost all the surface of the p-type semiconductor layer 160, or may have a grid form or a treelike form.

(Positive Electrode Bonding Pad 180)

The positive electrode bonding pad 180 serving as an electrode formed on the transparent positive electrode 170 is composed of a conventionally known material, such as Au, Al, Ti, V, Cr, Mn, Co, Zn, Ge, Zr, Nb, Mo, Ru, Ta, Ni and Cu, for example. The structure of the positive electrode bonding pad 180 is not particularly limited, and a conventionally known structure can be employed. The thickness of the positive electrode bonding pad 180 is in a range of 100 nm to 2000 nm, for example, and preferably in a range of 300 nm to 1000 nm.

(Negative Electrode Bonding Pad 190)

The negative electrode bonding pad 190 is formed so as to be in contact with the n-type contact layer 140a of the n-type semiconductor layer 140, in the films of the compound semiconductor layers 100 (the n-type semiconductor layer 140, the light-emitting layer 150 and the p-type semiconductor layer 160) further formed on the films of the intermediate layer 120 and the base layer 130 formed on the substrate 110. When the negative electrode bonding pad 190 is formed, a part of the p-type semiconductor layer 160, the light-emitting layer 150 and the n-type semiconductor layer 140 is removed. Then, the exposed region 140c of the n-type contact layer 140a is formed, and the negative electrode bonding pad 190 is formed thereon. The material of the negative electrode bonding pad 190 may have the same composition and structure as those of the positive electrode bonding pad 180. Negative electrodes having various compositions and structures are well known. These well-known negative electrodes can be used without any limitations, and can be provided by a conventional means well known in the art.

(Manufacturing Method of Multilayer Semiconductor Wafer SW)

In the present exemplary embodiment, a film of a material having been activated to react by plasma is formed on the above-described substrate 110 by using the sputtering method, thereby to form the intermediate layer 120. Here, nitrogen is used as the group V element. A ratio of nitrogen content in a gas at the time when the intermediate layer 120 is formed is set in a range of 50 vol % to 99 vol % or less, and the intermediate layer 120 is formed as a single crystal. Then, a film of the base layer 130 is formed on the intermediate layer 120 by the MOCVD method or the sputtering method, and thereby the compound semiconductor substrate 40 is formed.

Subsequently, with the compound semiconductor substrate 40 thus formed, and the multilayer semiconductor wafer SW is manufactured by using the MOCVD apparatus 1 according to the following procedure.

First of all, the compound semiconductor substrates 40 are placed one by one in the concave portions 30b of the six substrate holders 30. The base layer 130 of each compound semiconductor substrate 40 is arranged to be exposed outside. Subsequently, the six substrate holders 30 are installed in the six concave portions provided in the support 20 of the MOCVD apparatus 1. After that, the lid portion 12 with the protection member 60 attached thereto is closed, and thereby the lid portion 12 is brought into intimate contact with the container 11.

Next, supply of nitrogen $N_2$ toward the bottom of each concave portion of the support 20 through the gas supply port is started. Rotation of the shaft 21 is started. In response, the support 20 rotates in the direction of the arrow A, while the six substrate holders 30 attached to the support 20 rotate in the direction of the arrows B.

Additionally, power feeding to the coil of the heating unit 50 is started. A current flowing through the heating unit 50 heats the support 20 through electromagnetic induction. The six substrate holders 30 held by the support 20 and the compound semiconductor substrates 40 held by the respective substrate holders 30 are heated up to a predetermined temperature.

The compound semiconductor substrates 40 are heated to be in a range of 700 degrees C. to 1200 degrees C. The temperature of the compound semiconductor substrates 40 is adjusted to a value that is appropriate for growth of each crystal.

In the reaction chamber of the MOCVD apparatus 1, ammonia $NH_3$ and an organometallic (MO) gas for the n-type contact layer 140a supplied from the supply pipe 13 decompose around the heated compound semiconductor substrates 40, and a group III nitride semiconductor for the n-type contact layer 140a is grown on the compound semiconductor substrates 40. At this time, crystals of the group III nitride semiconductor for the n-type contact layer 140a are epitaxially grown on the base layer 130 of each compound semiconductor substrate 40 heated up to the predetermined temperature.

In the reaction chamber of the MOCVD apparatus 1, when formation of the n-type contact layer 140a is completed, ammonia $NH_3$ and an organometallic (MO) gas for the n-type clad layer 140b supplied from the supply pipe 13 decompose around the heated compound semiconductor substrates 40, and a group III nitride semiconductor for the n-type clad layer 140b is grown on the compound semiconductor substrates 40. At this time, crystals of the group III nitride semiconductor for the n-type clad layer 140b are epitaxially grown on the n-type contact layer 140a formed on each compound semiconductor substrate 40 heated up to the predetermined temperature.

After that, by sequentially changing organometallic (MO) gases supplied to the reaction chamber, the light-emitting layer 150 having the plural barrier layers 150a and the plural well layers 150b and the p-type semiconductor layer 160 having the p-type clad layer 160a and the p-type contact layer 160b are sequentially formed on the n-type clad layer 140b formed on each compound semiconductor substrate 40. The multilayer semiconductor wafers SW can be obtained through the above procedure.

<Manufacturing Method of Light-Emitting Device Chip LC>

When the above-described film formation process is finished, the substrate holders 30 are taken out from the support 20, and further the multilayer semiconductor wafers SW are taken out from the respective substrate holders 30. The transparent positive electrode 170 is layered on the p-type semiconductor layer 160 of each multilayer semiconductor wafer SW, and the positive electrode bonding pad 180 is formed thereon. Additionally, the exposed region 140c is formed in the n-type contact layer 140a by etching or the like, and the negative electrode bonding pad 190 is provided in this exposed region 140c. After that, the surface of the substrate 110 opposite to the surface on which the intermediate layer 120 is formed is ground and abraded until the substrate 110 has a predetermined thickness. The wafer in which the thickness of the substrate 110 is adjusted is then cut into a square with sides of 350 µm, for example, and thereby the light-emitting device chips LC are obtained.

As has been described in detail, in the present exemplary embodiment, when the compound semiconductor layers 100 are epitaxially grown on the compound semiconductor substrate 40, the support members 32 supporting the circumferential edge of the compound semiconductor substrate 40 at three locations thereof are used to place the compound semiconductor substrate 40 without contacting the top surface of the substrate holder 30. This decreases the contact area between the compound semiconductor substrate 40 and the substrate holder 30, allowing for reducing (inhibiting) a local temperature change in the compound semiconductor substrate 40.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An apparatus for manufacturing a compound semiconductor by use of metal organic chemical vapor deposition comprising:
    a reaction container;
    a holder on which a formed body is to be placed so that a formed surface of the formed body on which layers of a compound semiconductor are to be formed faces upward, the holder being arranged in the reaction container; and
    a material supply port supplying a material gas of the compound semiconductor into the reaction container from outside, wherein
    the holder includes a support member supporting the formed body so that an undersurface of the formed body and a top surface of the holder on which the formed body is to be placed keep a predetermined distance,
    wherein the support member is a separately formed member of the holder inserted into at least three locations of a circumferential edge of the holder on which the formed body is to be placed,
    wherein the support member of the holder includes:
        a support surface for supporting an outer circumferential edge of the undersurface of the formed body; and
        an inclined surface configured to form a predetermined angle with respect to the support surface, and
    wherein the height of the inclined surface relative to a groove formed in the top surface of the holder gradually increases from the support surface in the direction of an outer circumferential edge of the holder.

2. The apparatus according to claim 1, wherein the support member of the holder is mounted in the form of a ring on a circumferential edge of the holder on which the formed body is to be placed.

3. The apparatus according to claim 1, wherein the support surface of the support member has such a predetermined height that the top surface of the holder on which the formed body is placed does not come into contact with the undersurface of the formed body supported by the support surface.

4. The apparatus according to claim 1, wherein the support member of the holder is made of a material having a coefficient of thermal conductivity of 10W/(m·K) or less.

5. The apparatus according to claim 4, wherein the support member of the holder is made of one selected from the group consisting of alumina ($Al_2O_3$), silicon nitride ($Si_3N_4$), silica glass ($SiO_2$) and zirconia ($ZrO_2$).

6. The apparatus according to claim 1, wherein the compound semiconductor is a group III nitride semiconductor.

7. The apparatus according to claim 1, wherein the support member is configured to provide line contact between the formed body and the inclined surface.

8. The apparatus according to claim 1, wherein the compound semiconductor is a group III nitride semiconductor manufactured by metal organic chemical vapor deposition.

9. The apparatus according to claim 1, wherein the predetermined distance is in a range of from 50 µm to 500 µm.

* * * * *